United States Patent
Gil

(10) Patent No.: US 9,373,419 B2
(45) Date of Patent: Jun. 21, 2016

(54) SEMICONDUCTOR MEMORY APPARATUS AND OPERATING METHOD THEREOF

(71) Applicant: SK hynix Inc., Icheon-si, Gyeonggi-do (KR)

(72) Inventor: Chan Gi Gil, Icheon-si (KR)

(73) Assignee: SK HYNIX INC., Icheon-si Gyeonggi-do (KR)

( * ) Notice: Subject to any disclaimer, the term of this patent is extended or adjusted under 35 U.S.C. 154(b) by 463 days.

(21) Appl. No.: 13/846,268

(22) Filed: Mar. 18, 2013

(65) Prior Publication Data

US 2014/0181588 A1 Jun. 26, 2014

(30) Foreign Application Priority Data

Dec. 24, 2012 (KR) .................. 10-2012-0151738

(51) Int. Cl.
*G11C 29/00* (2006.01)
*G11C 29/36* (2006.01)

(52) U.S. Cl.
CPC ........ *G11C 29/36* (2013.01); *G11C 2029/3602* (2013.01)

(58) Field of Classification Search
CPC ........ G11C 29/10; G11C 29/56; G11C 29/02; G11C 29/34; G11C 29/48; G11C 29/44; G11C 29/50; H05K 999/99
See application file for complete search history.

(56) References Cited

U.S. PATENT DOCUMENTS

| | | | | |
|---|---|---|---|---|
| 5,933,379 | A * | 8/1999 | Park et al. ................. | 365/201 |
| 6,452,849 | B1 * | 9/2002 | Iwamoto ................... | 365/201 |
| 6,476,652 | B1 * | 11/2002 | Lee et al. .................. | 327/158 |
| 6,493,829 | B1 * | 12/2002 | Kubo ........................ | 713/500 |
| 2002/0105838 | A1 * | 8/2002 | Maruyama et al. ....... | 365/194 |
| 2004/0227550 | A1 * | 11/2004 | Byun ........................ | 327/158 |
| 2004/0227554 | A1 * | 11/2004 | Park ......................... | 327/280 |
| 2005/0218945 | A1 * | 10/2005 | Kobayashi ............... | 327/112 |
| 2005/0231247 | A1 * | 10/2005 | Cho ......................... | 327/158 |
| 2005/0254318 | A1 * | 11/2005 | Jang et al. ................ | 365/194 |
| 2007/0132493 | A1 * | 6/2007 | Fujisawa et al. ......... | 327/158 |
| 2007/0147167 | A1 * | 6/2007 | Chu ......................... | 365/233 |
| 2008/0239845 | A1 * | 10/2008 | Na ........................... | 365/194 |
| 2009/0015302 | A1 * | 1/2009 | You .......................... | 327/158 |
| 2011/0156771 | A1 * | 6/2011 | Kim et al. ................ | 327/147 |
| 2011/0291717 | A1 * | 12/2011 | Lee ........................... | 327/158 |
| 2012/0124409 | A1 * | 5/2012 | Miyano ................ | G06F 1/10 713/503 |
| 2012/0269014 | A1 * | 10/2012 | Kim ......................... | 365/193 |
| 2012/0307581 | A1 * | 12/2012 | Kodama ............... | G11C 7/222 365/222 |

FOREIGN PATENT DOCUMENTS

KR        100482736 B1    4/2005
KR     1020050067544 A    7/2005

\* cited by examiner

*Primary Examiner* — Albert Decady
*Assistant Examiner* — Enamul M Kabir
(74) *Attorney, Agent, or Firm* — William Park & Associates Ltd.

(57) ABSTRACT

A semiconductor memory apparatus includes: a user setting unit configured to generate test data and a delay control signal in response to an external command and an external address; a delay locked loop (DLL) clock generation unit including a replica configured to have a delay time controlled in response to the delay control signal; and a data output unit configured to output the test data in response to a DLL clock signal outputted from the DLL clock generation unit.

5 Claims, 2 Drawing Sheets

SEMICONDUCTOR MEMORY APPARATUS AND OPERATING METHOD THEREOF

CROSS-REFERENCES TO RELATED APPLICATION

The present application claims priority under 35 U.S.C. §119(a) to Korean application number 10-2012-0151738, filed on Dec. 24, 2012, in the Korean Intellectual Property Office, which is incorporated herein by reference in its entirety.

BACKGROUND

1. Technical Field

Various embodiments relate to a semiconductor integrated circuit, and more particularly, to a semiconductor memory apparatus and an operating method thereof.

2. Related Art

A semiconductor memory apparatus is configured to store input data and output the stored data. At this time, the semiconductor memory apparatus outputs the stored data in response to a clock signal having the same phase as an external clock signal used an external device.

The semiconductor memory apparatus may include a circuit element for generating a delay locked loop (DLL) clock signal to output data at the same phase as the external clock signal.

Referring to FIG. 1, a conventional semiconductor memory apparatus 1 may include a delay unit 10, a phase comparison unit 20, a replica 30, and a fuse unit 40.

The delay unit 10 may be configured to decide a delay time in response to a comparison signal com_s, delay an external clock signal CLK_in by the decided delay time, and output the delayed signal as a DLL clock signal CLK_dll.

The phase comparison unit 20 may be configured to compare the phases of the external clock signal CLK_in and a feedback clock signal CLK_fb and generate the comparison signal com_s.

The replica 30 may be configured to delay the DLL clock signal CLK_dll and generate the feedback clock signal CLK_fb. The replica 30 may have a delay time obtained by modeling an internal delay time of the semiconductor memory apparatus 1.

The fuse unit 40 may be configured to provide a plurality of delay control signals DL_ctrl<0:n> to the replica 30, in order to control the delay time of the replica 30. The fuse unit 40 may include a plurality of fuses (not shown), and generate the plurality of delay control signals DL_ctrl<0:n> depending on the respective fuses are cut or not.

The delay time of the replica 30 may be initially set during the replica 30 is designed. Then, during a test operation, the initially-set delay time may be controlled and corrected through a fuse cutting technique.

However, after the semiconductor memory apparatus is shipped from a manufacturer, the delay time of the replica 30 cannot be controlled. Therefore, when a user uses the semiconductor memory apparatus in a poor environment, the delay time of the replica 30 needs to be controlled again.

SUMMARY

In an embodiment of the present invention, a semiconductor memory apparatus includes: a user setting unit configured to generate test data and a delay control signal in response to an external command and an external address; a delay locked loop (DLL) clock generation unit including a replica configured to have a delay time controlled in response to the delay control signal; and a data output unit configured to output the test data in response to a DLL clock signal outputted from the DLL clock generation unit.

In an embodiment of the present invention, an operating method of a semiconductor memory apparatus includes the steps of: inputting an external command so as to cause the semiconductor memory apparatus to enter a register setting mode; inputting an external command to store test data and a delay control signal in a setting register; controlling the phase of a DLL clock signal by controlling a delay time of a replica according to the delay control signal; and outputting the test data in response to the DLL clock signal, and comparing the phases of the output test data and an external clock signal.

In an embodiment of the present invention, a delay locked loop (DLL), comprises a delay unit configured to delay an external clock signal by a set delay time, to generate the DLL clock signal; a phase comparison unit configured to generate a comparison signal by comparing the external clock signal and a feedback clock signal based on the DLL clock signal; and a replica configured to control a delay time of the DLL clock signal provided from an output terminal of the delay unit in response to a delay control signal, to generate the feedback clock, wherein the delay control signal is generated in response to an external command and an external address.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus and an operating method thereof according to the present invention will be described below with reference to the accompanying drawings through exemplary embodiments.

Figure 1:
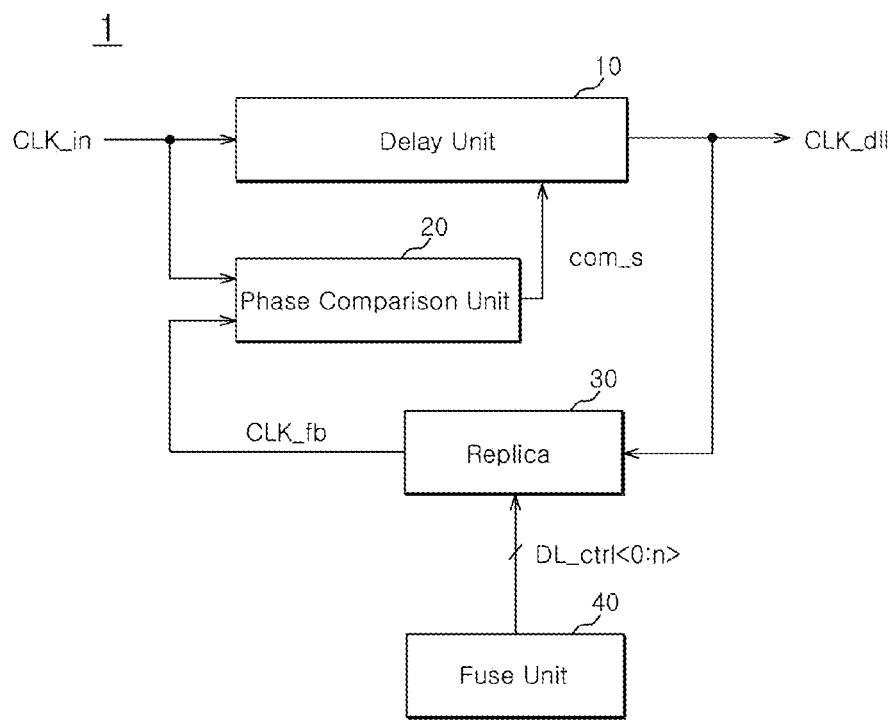
FIG. 1 is a block diagram of a conventional semiconductor memory apparatus.
Figure 2:
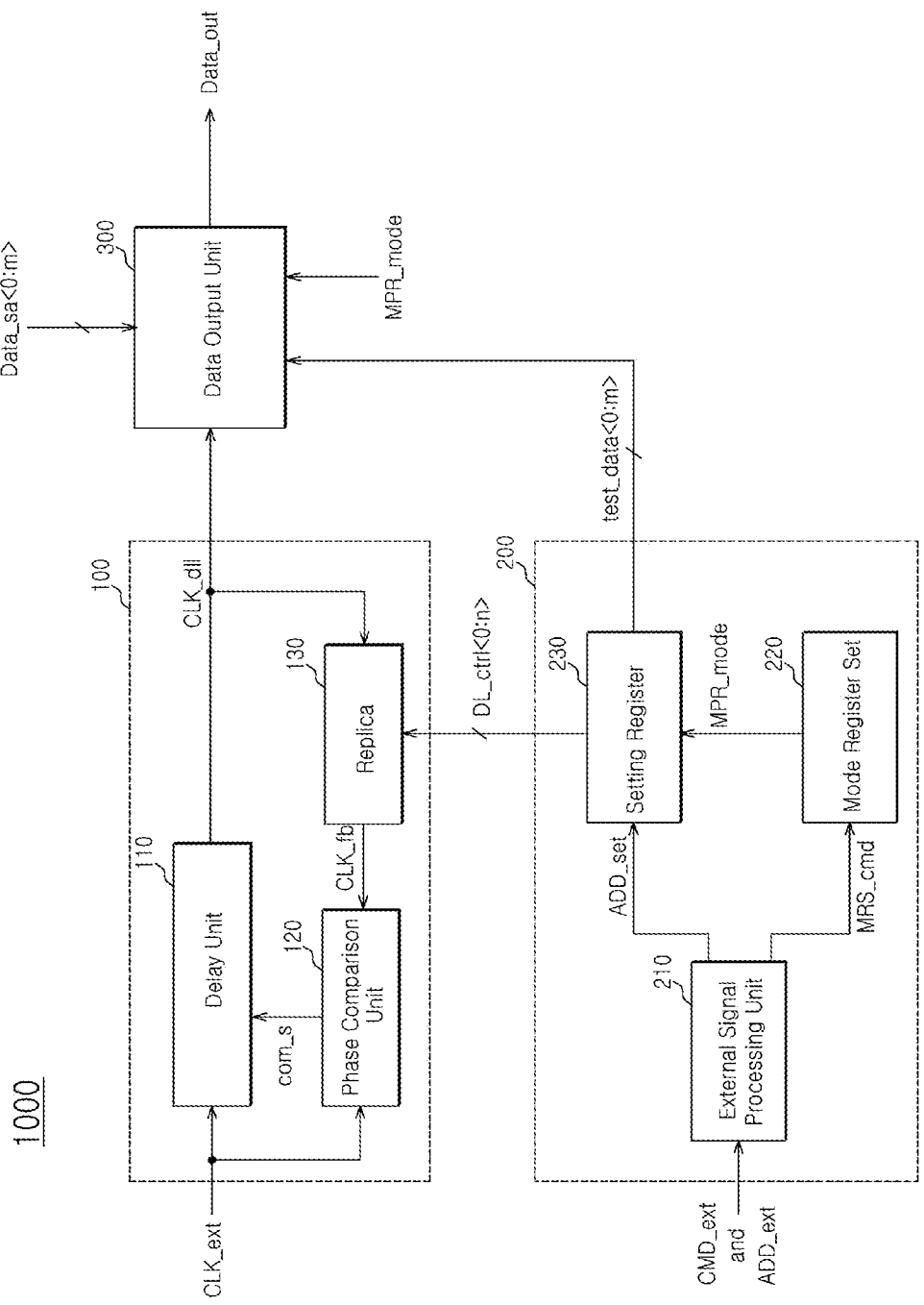
FIG. 2 is a block diagram of a semiconductor memory apparatus according to one embodiment of the present invention.

Referring to FIG. 2, a semiconductor memory apparatus 1000 according to one embodiment of the present invention may include a DLL clock generation unit 100, a user setting unit 200, and a data output unit 300.

The DLL clock generation unit 100 may include a delay unit 110, a phase comparison unit 120, and the replica 130.

The delay unit 110 may be configured to decide a delay time in response to a comparison signal com_s, delay an external clock signal CLK_ext by the decided delay time, and generate a DLL clock signal CLK_dll.

The phase comparison unit 120 may be configured to compare the phases of the external clock signal CLK_ext and a feedback clock signal CLK_fb provided from the replica 130 and generate the comparison signal com_s.

The replica 130 may be configured to have a delay time decided in response to the delay control signal DL_ctrl<0:n> provided from the user setting unit 200, delay the DLL clock signal CLK_dll by the decided delay time, and output the delayed signal as the feedback signal CLK_fb. That is, the replica 130 may control the delay time in response to the delay control signal DL_ctrl<0:n>.

The user setting unit 200 may be configured to generate test data test_data<0:m> and the delay control signal DL_ctrl<0:n> in response to an external command CMD_ext and an external address ADD_ext.

The user setting unit 200 may include an external signal processing unit 210, a mode register set 220, and a setting register 230.

The external signal processing unit 210 may be configured to generate a mode register set mode command MRS_cmd and a setting address ADD_set. The mode register set mode command MRS may be generated in response to the external command CMD_ext. The setting address ADD_set may be obtained by buffering the external address ADD_ext. The external signal processing unit 210 may include a decoder configured to decode the external command CMD_ext and a buffer configured to buffer the external address ADD_ext.

The mode register set 220 may be configured to generate a register setting mode signal MPR_mode in response to the mode register set mode command MRS_cmd.

The setting register 230 may be configured to store the setting address ADD_set as the test data test_data<0:m> in response to the register setting mode signal MPR_mode, and store the setting address ADD_set as the delay control signal DL_ctrl<0:n>.

The data output unit 300 may be configured to generate output data Data_out in response to the DLL clock CLK_dll and the register setting mode signal MPR_mode is disabled. The data output unit 300 may be configured to receive data Data_sa<0:m> which are stored in a bank (not shown) and the test data test_data<0:m> from the user setting unit 200 and selectively output the data Data_sa<0:m> or the test data test_data<0:m> in response to the register setting mode signal MPR_mode and the DLL clock signal CLK_dll, as output data Data_out. For example, the data output unit 300 may be configured to output the stored data Data_sa<0:m> as the output data Data_out in synchronization with the DLL clock signal CLK_dll when the register setting mode signal MPR_mode is disabled, and output the test data test_data<0:m> as the output data Data_out in synchronization with the DLL clock signal CLK_dll when the register setting mode signal MPR_mode is enabled.

The operation of the semiconductor memory apparatus configured in such a manner will be described as follows.

First, an operation in which a user controls the delay time of the replica 130 will be described.

The external signal processing unit 210 may generate the mode register set mode command MRS_cmd in response to the external command CMD_ext. The external signal processing unit 210 may buffer the external address ADD_ext, to output the setting address ADD_set.

The mode register set 220 may enable a register setting mode signal MPR_mode when the mode register set mode command MRS_cmd is enabled.

Then, the setting register 230 may store the setting address ADD_set as the delay control signal DL_ctrl<0:n> and the test data test_data<0:m> when the register setting mode signal MPR_mode is enabled.

The replica 130 may delay the DLL clock signal CLK_dll by a delay time based on the delay control signal DL_ctrl<0:n> and output the delayed signal as the feedback clock signal CLK_fb.

The phase comparison unit 120 may compare the phases of the external clock signal CLK_ext and the feedback clock signal CLK_fb and generates the comparison signal com_s as a comparison result.

The delay unit 110 may delay the external clock signal CLK_ext by a delay time based on the comparison signal com_s and generates the DLL clock signal CLK_dll.

The data output unit 300 may output the test data test_data<0:m> as output data Data_out in synchronization with the DLL clock signal CLK_dll, when the register setting mode signal MPR mode is enabled.

Second, an operation after the user sets the delay time of the replica 130 will be described.

The external signal processing unit 210 and the mode register set 220 may disable the register setting mode signal MPR_mode in response to the external command CMD_ext.

Since the setting register 230 may store the delay control signal DL_ctrl<0:n>, the signal value of the delay control signal DL_ctrl<0:n> is maintained even though the register setting mode signal MPR_mode is disabled.

The replica 130 may have a delay time corresponding to the stored delay control signal DL_ctrl<0:n>, delay the DLL clock signal CLK_dll, and output the delayed signal as the feedback clock signal CLK_fb.

The output unit 300 may output the stored data Data_sa<0:m> in synchronization with the DLL clock signal CLK_dll, when the register setting mode signal MPR_mode is disabled.

Third, an operation in which the user sets the delay time of the replica 130 will be described.

The user may input an external command CMD_ext to the user setting unit 200 such that the mode register set 220 may enable the register mode setting signal MPR_mode. Then, the semiconductor memory apparatus 1000 enters the register mode setting mode.

The user may input an external address ADD_ext to store the delay control signal DL_ctrl<0:n> and the test data test_data<0:m> in the setting register 230.

According to the stored delay control signal DL_ctrl<0:n>, the delay time of the replica 130 may be varied. When the delay time of the replica 130 is varied, the phase of the DLL clock signal CLK_dll generated by the DLL clock generation unit 100 may be varied. That is, the value of the delay control signal DL_ctrl<0:n> is varied by the user, and the delay time of the replica 130 is controlled, so as to control the phase of the DLL clock signal CLK_dll.

The test data test_data synchronized with the DLL clock signal CLK_dll are outputted as the output data Data_out.

The phases of the external clock signal CLK_ext may be compared with the output data Data_out. At this time, when the phases of the external clock signal CLK_ext and the output data Data_out are different from each other, the user may input the external address ADD_ext to store the test data test_data<0:m> and the delay control signal DL_ctrl<0:n> in the setting register 230. According to the stored delay control signal DL_ctrl, the delay time of the replica 130 may be varied, and the phase of the DLL clock signal CLK_dll may be varied. The test data test_data<0:m> may be outputted as the output data Data_out in synchronization with the DLL clock signal CLK_dll.

The operation is repeated until the test data test_data<0:m> and the external clock signal CLK_ext have the same phase.

In the semiconductor memory apparatus and the operating method thereof according to the embodiment of the present invention, the delay time of the replica may be controlled by a user, unlike a conventional semiconductor memory apparatus including a replica having a fixed delay time depending on fuse cutting. Therefore, the semiconductor memory apparatus may normally operate in any environments, and may perform an operation desired by a user.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
a user setting unit configured to generate test data and a delay control signal in response to an external command and an external address;
a delay locked loop (DLL) clock generation unit comprising a replica configured to have a delay time controlled in response to the delay control signal; and
a data output unit configured to receive the test data from the user setting unit and output the test data in response to a DLL clock signal provided from the DLL clock generation unit,
wherein the user setting unit comprises:
an external signal processing unit configured to generate a mode register set mode command in response to the external command, and buffer the external address, to generate a setting address;
a mode register set configured to generate a register setting mode signal in response to the mode register set mode command; and
a setting register configured to store and output the setting address as the test data in response to the register setting mode signal, and store and output the setting address as the delay control signal.

2. The semiconductor memory apparatus according to claim 1, wherein the DLL clock generation unit further comprises:
a delay unit configured to decide a delay time in response to a comparison signal, and delay an external clock signal by the decided delay time so as to generate the DLL clock signal; and
a phase comparison unit configured to compare the phases of the external clock signal and a feedback clock signal and generate the comparison signal,
wherein the replica is configured to decide a delay time in response to the delay control signal, delay the DLL clock signal by the decided delay time, and output the delayed signal as the feedback clock signal.

3. The semiconductor memory apparatus according to claim 1, wherein the data output unit is configured to selectively output data which is stored in a bank or the test data in response to the register setting mode signal and the DLL clock signal.

4. The semiconductor memory apparatus according to claim 3, wherein the data output unit is configured to output the stored data in synchronization with the DLL clock signal when the register setting mode signal is disabled, and output the test data in synchronization with the DLL clock signal when the register setting mode signal is enabled.

5. A delay locked loop (DLL), comprising:
a delay unit configured to delay an external clock signal by a set delay time, to generate the DLL clock signal;
a phase comparison unit configured to generate a comparison signal by comparing the external clock signal and a feedback clock signal based on the DLL clock signal; and
a replica configured to control a delay time of the DLL clock signal provided from an output terminal of the delay unit in response to a delay control signal, to generate the feedback clock,
wherein the delay control signal is provided from an user setting unit which is positioned outside the DLL,
wherein the user setting unit comprises:
an external signal processing unit configured to generate a mode register set mode command in response to the external command, and buffer the external address, to generate a setting address,
a mode register set configured to generate a register setting mode signal in response to the mode register set mode command; and
a setting register configured to store and output the setting address as the test data in response to the register setting mode signal, and store and output the setting address as the delay control signal.

* * * * *